United States Patent
Ho et al.

(10) Patent No.: US 10,334,728 B2
(45) Date of Patent: Jun. 25, 2019

(54) REDUCED-DIMENSION VIA-LAND STRUCTURE AND METHOD OF MAKING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW); Po-Shu Peng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/019,776

(22) Filed: Feb. 9, 2016

(65) Prior Publication Data
US 2017/0231093 A1    Aug. 10, 2017

(51) Int. Cl.
| H05K 1/11 | (2006.01) |
| H05K 3/10 | (2006.01) |
| H05K 3/40 | (2006.01) |
| H05K 3/00 | (2006.01) |

(52) U.S. Cl.
CPC .............. *H05K 1/116* (2013.01); *H05K 3/10* (2013.01); *H05K 3/4038* (2013.01); *H05K 3/0035* (2013.01)

(58) Field of Classification Search
CPC ...... H05K 1/116; H05K 1/114; H05K 3/4038; H05K 1/0251; H05K 1/112; H05K 1/113
USPC ........................................................ 361/767
See application file for complete search history.

(56) References Cited

U.S. PATENT DOCUMENTS

| 5,776,662 | A  | * | 7/1998  | Shirai ................. H01L 21/4857 257/E23.062 |
| 6,228,466 | B1 | * | 5/2001  | Tsukada ............ H01L 23/49816 174/255 |
| 6,326,559 | B1 | * | 12/2001 | Yoshioka ............. H05K 3/0035 174/255 |
| 8,304,665 | B2 |   | 11/2012 | Chang et al. |
| 8,323,771 | B1 | * | 12/2012 | Huemoeller ........... H05K 1/116 174/265 |
| 8,418,361 | B2 |   | 4/2013  | Lee et al. |
| 8,671,565 | B1 | * | 3/2014  | Kuo ..................... H01L 21/486 257/145 |
| 8,797,757 | B2 |   | 8/2014  | Kaneko et al. |

(Continued)

*Primary Examiner* — Steven T Sawyer
(74) *Attorney, Agent, or Firm* — Foley & Lardner LLP; Cliff Z. Liu

(57) ABSTRACT

A package substrate includes a dielectric layer, a conductive via disposed in the dielectric layer, and a conductive pattern layer exposed from a first surface of the dielectric layer. The conductive pattern layer includes traces and a via land, the via land extends into the conductive via, and a circumferential portion of the via land is encompassed by the conductive via. A method of making a package substrate includes forming a conductive pattern layer including traces and a via land, providing a dielectric layer to cover the conductive pattern layer, and forming a via hole. Forming the via hole is performed by removing a portion of the dielectric layer and exposing a bottom surface of the via land and at least a portion of a side surface of the via land. A conductive material is applied into the via hole to form a conductive via covering the via land.

17 Claims, 7 Drawing Sheets

(56) References Cited

U.S. PATENT DOCUMENTS

| | | | |
|---|---|---|---|
| 2005/0155792 A1* | 7/2005 | Ito | H05K 3/4069 |
| | | | 174/264 |
| 2008/0179744 A1* | 7/2008 | Yu | H01L 21/6835 |
| | | | 257/750 |
| 2008/0225501 A1* | 9/2008 | Cho | H05K 3/421 |
| | | | 361/767 |
| 2011/0147061 A1* | 6/2011 | Leung | H01L 21/486 |
| | | | 174/260 |
| 2012/0066902 A1 | 3/2012 | Kim et al. | |
| 2012/0175153 A1* | 7/2012 | Kaneko | H05K 1/113 |
| | | | 174/251 |
| 2014/0131073 A1* | 5/2014 | Itabashi | H05K 1/185 |
| | | | 174/255 |
| 2015/0016082 A1 | 1/2015 | Lee | |
| 2016/0073515 A1* | 3/2016 | Shimizu | H05K 1/185 |
| | | | 361/761 |

\* cited by examiner

REDUCED-DIMENSION VIA-LAND STRUCTURE AND METHOD OF MAKING THE SAME

BACKGROUND

1. Technical Field

The present disclosure relates generally to a package substrate including a via structure and method of making the same. More particularly, the present disclosure relates to a package substrate including reduced-dimension via-land structures.

2. Description of the Related Art

There is continued demand for miniaturization, weight reduction, improved performance, improved reliability and lower costs in electronic products, such as for mobile phones and wearable electronics. Accordingly, the complexity of circuits and the need for compactness and miniaturization have increased.

In addition to the demands on electronic products described above, demands on package substrates in the electronic products include a demand for increased numbers of input/output signals. To accommodate large numbers of input/output signals, high density interconnect pitch can be implemented for adjoining semiconductor devices or substrates. However, a base substrate may also include a lower density interconnect pitch for connecting the input/output signals of a semiconductor device package to a system substrate (e.g., a printed circuit board onto which the semiconductor device package substrate is mounted). It can be difficult to meet the requirements of both higher and lower density interconnect pitches in a base substrate.

SUMMARY

In some embodiments, a package substrate includes a dielectric layer, a conductive via disposed in the dielectric layer, and a conductive pattern layer exposed from a first surface of the dielectric layer. The conductive pattern layer includes traces and a via land, the via land extends into the conductive via, and a circumferential portion of the via land is encompassed by the conductive via.

In some embodiments, a package substrate includes a dielectric layer, a conductive via extending through the dielectric layer, and a conductive pattern layer exposed from a first surface of the dielectric layer. The conductive pattern layer includes traces and a via land. The conductive via includes a recess, and the via land is embedded in the recess.

In some embodiments, a method of making a package substrate includes forming a conductive pattern layer, providing a dielectric layer to cover the conductive pattern layer, and forming a via hole. The conductive pattern layer includes traces and a via land, and the via land includes a bottom surface and a side surface. Forming the via hole is performed by removing a portion of the dielectric layer and exposing the bottom surface of the via land and at least a portion of the side surface of the via land. The method further includes applying a conductive material into the via hole to form a conductive via covering the via land.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

A via may be used to provide interconnection (e.g., electrical interconnection) between layers on different sides of a double-sided package substrate, or between layers of a multi-layer package substrate. A via land may be included to provide stable electrical connection between the via and a layer.

A via land dimension (e.g., diameter) is often larger than a dimension (e.g., diameter) of a corresponding via, which can limit trace layout on a package substrate because the via lands occupy space that could otherwise be occupied by traces. To retain the via lands while increasing space for trace routing, the present disclosure relates in one aspect to a package substrate with reduced-dimension via-land structures.

Additionally, the via lands according to the present disclosure may be used to protect metal layers beneath the via lands during laser ablation while forming via holes in the dielectric layer, and without the via lands, damage to the metal layers may result from laser energy directed on the metal layers. Chemicals used in a subsequent process stage may enter the damaged metal layers and cause the metal layers to peel off or peel away from each other. Accordingly, via lands provide protection for metal layers during manufacture. Dimensions of the via land are designed in consideration of manufacturing tolerances of forming a via, such as providing for laser tolerance when forming a via hole. The via land may also be used as a stop marker for laser penetration.

Figure 1:
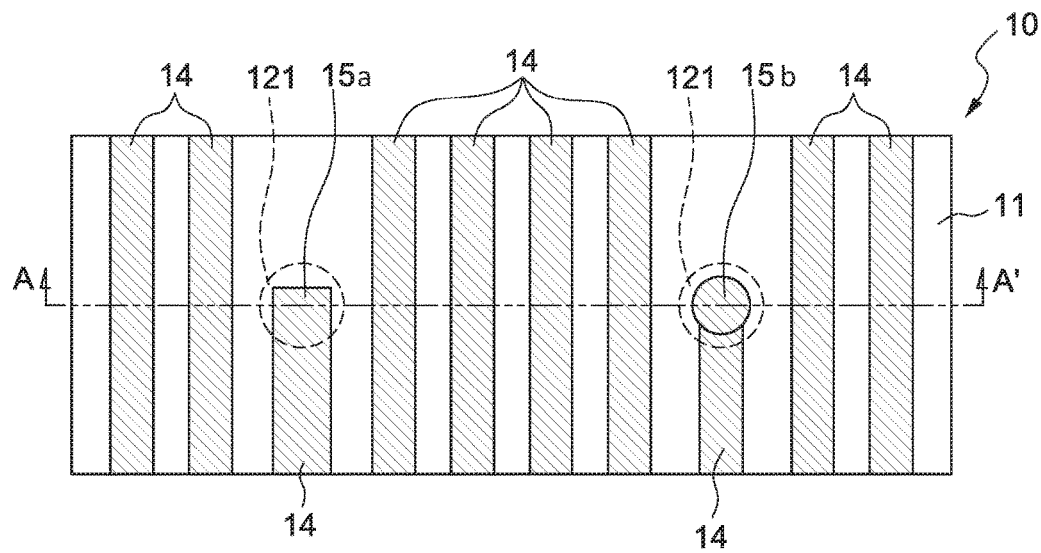
FIG. 1 illustrates a top view of a via structure of a package substrate in accordance with an embodiment of the present disclosure.
Figure 2:
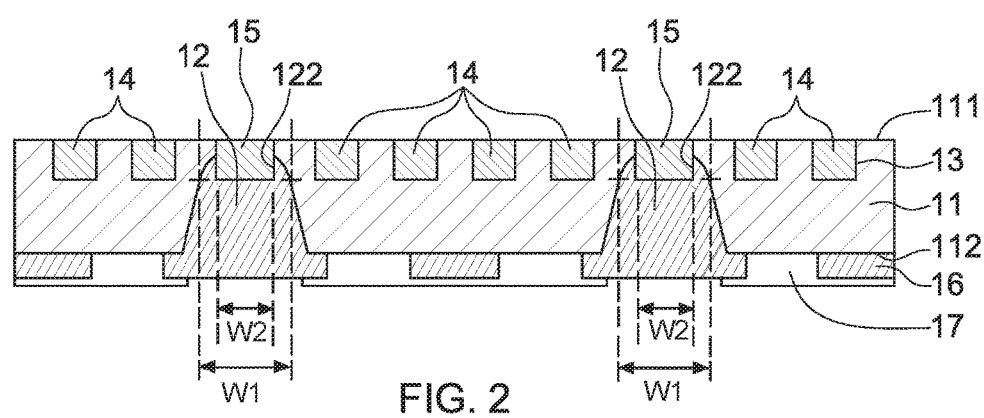
FIG. 2 illustrates a cross-sectional view of the via structure of the package substrate shown in FIG. 1.

FIG. 1 illustrates a top view of a via structure of a package substrate 10 in accordance with an embodiment of the present disclosure. FIG. 1 shows a portion of the package substrate 10, which may extend further in one or more directions (e.g., along a plane or planes parallel to the drawing sheet containing FIG. 1). FIG. 2 illustrates a cross-sectional view of the package substrate 10 across line AA' of FIG. 1. Referring to FIGS. 1 and 2, the package substrate 10 includes a dielectric layer 11, conductive vias 12, a conductive pattern layer 13, a conductive pattern layer 16 and a solder resist layer 17.

The package substrate 10 may be a supporting substrate (such as a core substrate) for mounting a number of chips or dies thereon. The dielectric layer 11 may be, or may include, for example, a monocrystalline silicon, a polycrystalline silicon, an amorphous silicon, other suitable materials, or a combination thereof. The dielectric layer 11 may be, or may include, for another example, a sheet made from pre-impregnated composite fibers.

The conductive vias 12 and the conductive pattern layer 13 may be, or may include, copper, aluminum, gold, another metal, a metal alloy, another suitable conductive material, or a combination thereof.

The dielectric layer 11 includes a first surface 111 and a second surface 112. The conductive pattern layer 13 is exposed from the first surface 111 of the dielectric layer 11 and does not protrude from the first surface 111 of the dielectric layer 11 (e.g., the conductive pattern layer 13 is substantially coplanar with, or recessed from, the first surface 111 of the dielectric layer 11). The conductive pattern layer 13 includes traces 14 and via lands 15 including via lands 15a and 15b. The via lands 15 are the portions of the conductive pattern layer 13 that are in contact with the conductive vias 12. Each via land 15 extends into (is embedded in) a recess 122 of a corresponding conductive via 12, and a circumferential portion of the via land 15 is encompassed by the conductive via 12 (e.g., the conductive via 12 contacts a lateral surface of the via land 15 around a circumference of the via land 15). The conductive vias 12 are recessed from the first surface 111 of the dielectric layer 11.

A lateral dimension W1 (e.g., diameter or width) of the conductive via 12 at a bottom surface of the via land 15 (shown in FIG. 2 and indicated by a dotted circle 121 in FIG. 1) is greater than a lateral dimension W2 of the via land 15, to provide adhesion between the via land 15 and the conductive via 12 along sidewalls of the recess 122. Further, because the lateral dimension W2 at a top surface of the via land 15 is less than the lateral dimension W1 of the conductive via 12, the via land 15 occupies less space on the first surface 111 of the dielectric layer 11 as compared to a space that the conductive via 12 would occupy if it was exposed at the first surface 111.

The conductive pattern layer 16 is disposed on the second surface 112 of the dielectric layer 11. In one or more embodiments, the conductive vias 12 and the conductive pattern layer 16 are an integrated structure (e.g., formed in a same process stage).

The via land 15 can be any shape. For example, as illustrated in FIG. 1, via land 15 may be a rectangular/square via land 15a, or an elliptical/circular via land 15b. The via land 15 may be a portion of a trace 14. The via land 15 can be used as a bonding pad for connecting between components attached on the package substrate 10 or for interconnection between substrates. The lateral dimension W2 of the portion of the via land 15 exposed from the first surface 111 of the dielectric layer 11 is less than or equal to a lateral dimension (e.g., a diameter) of the conductive via 12 throughout a height of the conductive via 12. In one or more embodiments, the dimension W2 of the portion of the via land 15 can be about 7 micrometers (μm), such as less than about 8 μm, less than about 9 μm, or less than about 10 μm. The reduced-dimension via land 15 allows for an increase in trace 14 density (e.g., increase circuit density of the package substrate 10), a decrease in a size of the package substrate 10, wider traces 14, or a relaxation of trace 14 routing rules.

Figure 3:
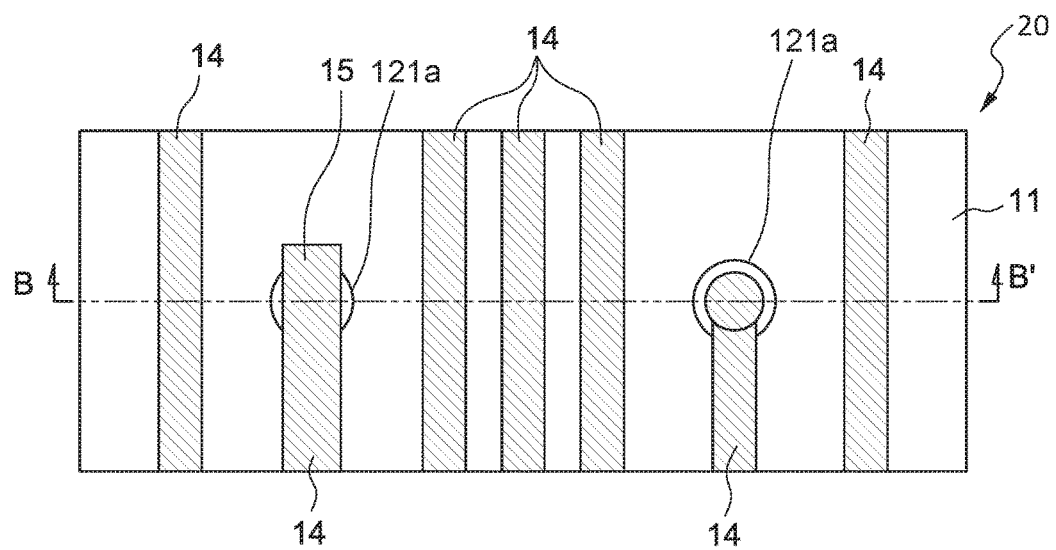
FIG. 3 illustrates a top view of a via structure of a package substrate in accordance with an embodiment of the present disclosure.
Figure 4:
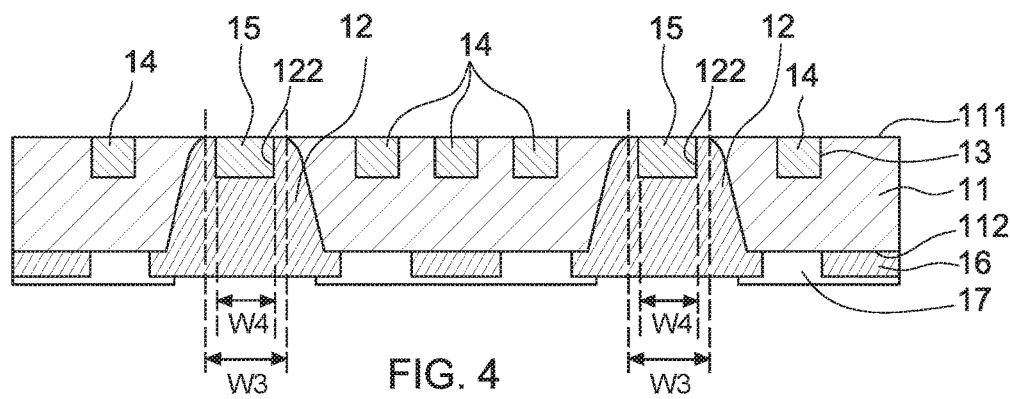
FIG. 4 illustrates a cross-sectional view of the via structure of the package substrate shown in FIG. 3.

FIG. 3 illustrates a top view of a via structure of a package substrate 20 in accordance with an embodiment of the present disclosure. FIG. 3 shows a portion of the package substrate 20, which may extend further in one or more directions (e.g., along a plane or planes parallel to the drawing sheet containing FIG. 3). FIG. 4 illustrates a cross-sectional view of the package substrate 20 across line BB' of FIG. 3. Similarly to FIGS. 1 and 2, the package substrate 20 of FIGS. 3 and 4 includes a dielectric layer 11, a conductive pattern layer 13, a conductive pattern layer 16 and a solder resist layer 17, where the conductive pattern layer 13 includes traces 14 and via lands 15, and each via land 15 extends into a corresponding conductive via 12. However, in the embodiment illustrated in FIGS. 3 and 4, the conductive via 12 is exposed from the first surface 111 of the dielectric layer 11, and a lateral dimension W3 of the conductive via 12 at the first surface 111 (shown in FIG. 4 and indicated by a circle 121a in FIG. 3) is greater than a lateral dimension W4 of the via land 15 at the first surface 111. In this embodiment, the via land 15 does not protrude from the recess 122 and does not contact the dielectric layer 11. In this embodiment, the electrical contact between the via land 15 and the conductive via 12 may be improved; however, an available space on the first surface 111 of the dielectric layer 11 (e.g., space for trace 14 routing) may be decreased due to the exposure of the conductive via 12 at the surface 111 of the dielectric layer 11.

FIGS. 5A-5D illustrate a manufacturing method in accordance with an embodiment of the present disclosure.

Figure 5A:
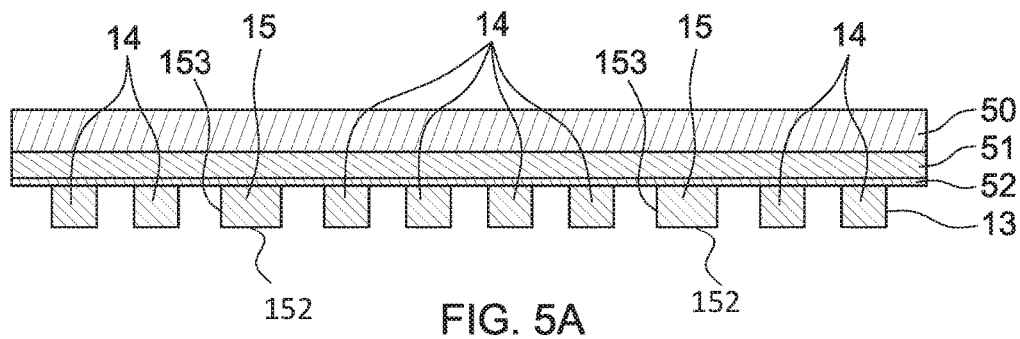
FIG. 5A, FIG. 5B, FIG. 5C and FIG. 5D illustrate a method in accordance with an embodiment of the present disclosure.

Referring to FIG. 5A, a carrier 50 is provided. A metal layer 51 is formed on the carrier 50. A metal layer 52, which has a thickness less than a thickness of the metal layer 51, is formed on the metal layer 51. A conductive pattern layer 13 is then formed on the metal layer 52, for example by a plating technique. The conductive pattern layer 13 includes traces 14 and via lands 15. Each of the via lands 15 includes a bottom surface 152 and a side surface 153. In one or more embodiments, the metal layer 51 is a copper foil about 18 μm thick, such as about 17 μm to about 19 μm. In one or more embodiments, the metal layer 52 is a copper foil about 3 μm thick, such as about 2 μm to about 4 μm. In one or more embodiments, portions of the conductive pattern layer 13 are about 20 μm thick, such as about 19 μm to about 21 μm; and the via land 15 is about 20 μm thick or less, such as less than about 21 μm, less than about 19 μm, or less than about 18 μm. The thickness of the via land 15 may depend in part on a width or a diameter of the via land 15.

Figure 5B:
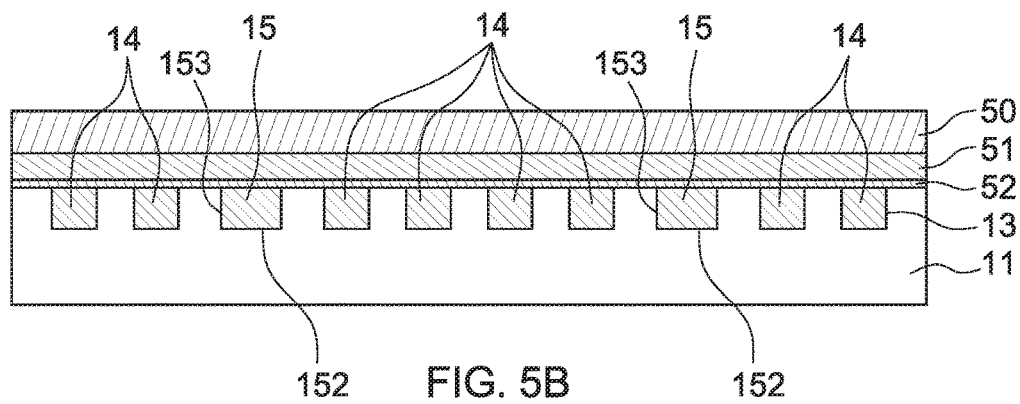

Referring to FIG. 5B, a dielectric layer 11 is stacked or laminated on the metal layer 52 to cover the conductive pattern layer 13.

Figure 5C:
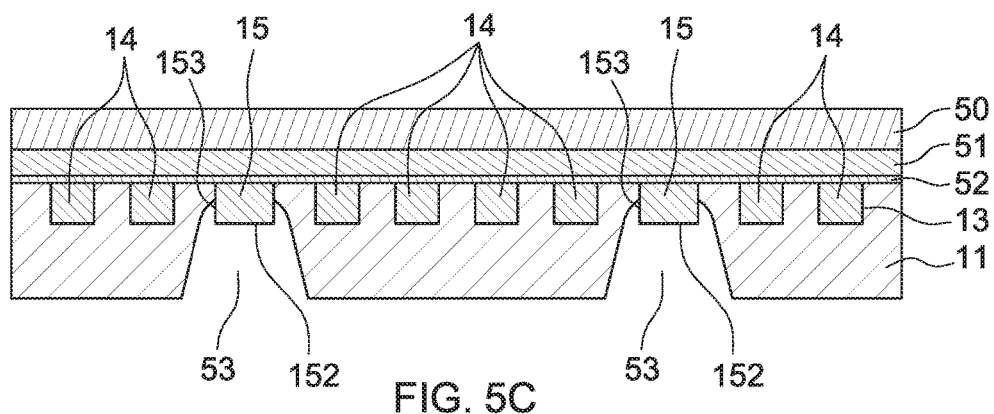

Referring to FIG. 5C, via holes 53 are formed by removing a portion of the dielectric layer 11 to expose the bottom surface 152 of each via land 15 and expose a portion of the side surface 153 of each via land 15. In this embodiment, the metal layers 51 and 52 are not exposed. A diameter and a volume of the via hole 53 is relatively less than would be the case if sufficient amounts of the dielectric layer 11 were to be removed to expose the metal layer 52 or the metal layer 51. Thus, a volume of material that will fill the via hole 53 is relatively reduced, and a dimpling caused by filling of the via hole 53 by plating can also be reduced. Additionally, because a portion of the dielectric layer 11 remains over the metal layer 52, damage to the metal layer 52 may be avoided, and chemicals (e.g., electroplate liquid) are prevented from permeating into the interface between the metal layers 51 and 52, which can cause peeling of the metal layers 51 and 52.

The registration accuracy of a laser beam is, for example, ±15 μm, such that the dielectric layer 11 may be removed up to about 15 μm beyond the periphery of the via land 15 at any point on the periphery of the via land 15. Accordingly, for a ±15 μm registration accuracy a cross-sectional dimension (e.g., diameter) of the via hole 53 at the bottom surface 152 of the via land 15 may be a dimension (e.g., diameter) of the via land 15 plus 30 μm. As discussed above, the dimension (e.g., diameter) of the via land 15 can be as small as about 7 μm; thus, the dimension (e.g., diameter) of the via hole 53 may be about 37 μm or less at the bottom surface 152 of the via land 15. By way of comparison, a diameter of a conventional via may be about 40 μm to about 60 μm. Therefore, the via hole 53 is a reduced-dimension via hole.

Figure 5D:
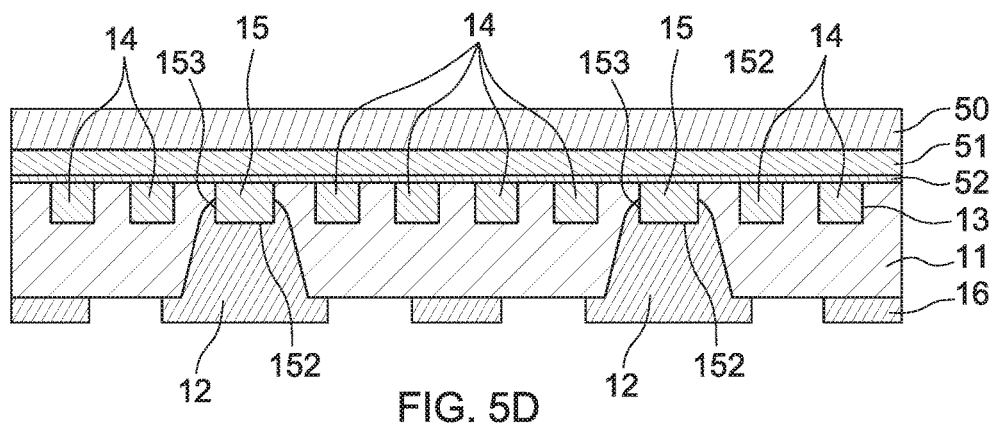

Referring to FIG. 5D, a conductive material such as copper, aluminum, gold, another suitable metal or alloy, or a combination thereof, is plated or otherwise disposed in one or more layers in the via holes 53 to form conductive vias 12 over the via lands 15. The conductive vias 12 are reduced-dimension vias. A conductive pattern layer 16 may be formed concurrently with the conductive vias 12. Alternatively, the conductive pattern layer 16 may be formed in another process stage. The metal layer 51 and the carrier 50 are then removed by peeling to expose the metal layer 52, and the metal layer 52 can be removed by etching to expose the conductive pattern layer 13. The manufacturing method of FIGS. 5A-5D may be used to form the package substrate 10 as shown in FIGS. 1 and 2.

FIGS. 6A-6D illustrate a manufacturing method in accordance with an embodiment of the present disclosure.

Figure 6A:
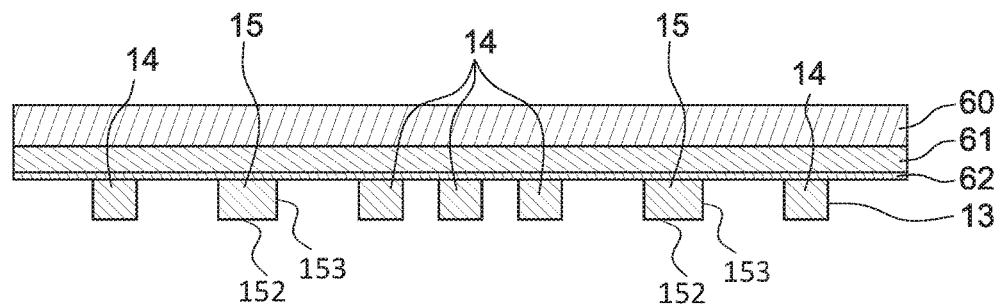
FIG. 6A, FIG. 6B, FIG. 6C and FIG. 6D illustrate a method in accordance with an embodiment of the present disclosure.

Referring to FIG. 6A, a carrier 60 is provided. A metal layer 61 is formed on the carrier 60. A metal layer 62, which has a thickness less than a thickness of the metal layer 61, is formed on the metal layer 61. A conductive pattern layer 13 is then formed on the metal layer 62, for example by a plating technique. The conductive pattern layer 13 includes traces 14 and via lands 15. Each of the via lands 15 includes a bottom surface 152 and a side surface 153. In one or more embodiments, the metal layer 61 is a copper foil about 18 μm thick, such as about 17 μm to about 19 μm. In one or more embodiments, the metal layer 62 is a copper foil about 3 μm thick, such as about 2 μm to about 4 μm. In one or more embodiments, portions of the conductive pattern layer 13 are about 20 μm thick, such as about 19 μm to about 21 μm; and the via land 15 is about 20 μm thick or less, such as less than about 21 μm, less than about 19 μm, or less than about 18 μm. The thickness of the via land 15 may depend in part on a width or a diameter of the via land 15.

Figure 6B:
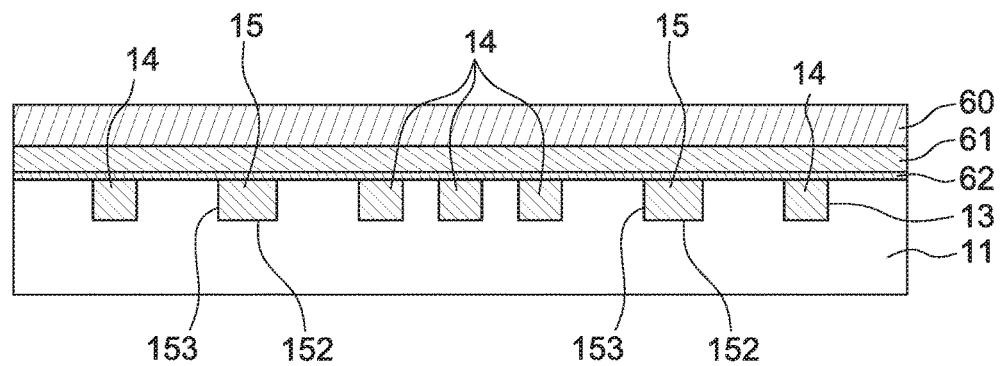

Referring to FIG. 6B, a dielectric layer 11 is stacked or laminated on the metal layer 62 to cover the conductive pattern layer 13.

Figure 6C:
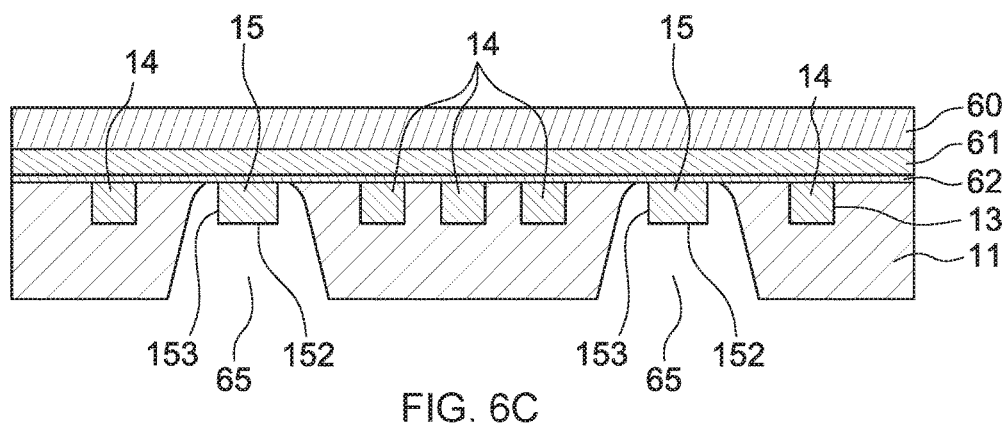

Referring to FIG. 6C, via holes 65 are formed by removing a portion of the dielectric layer 11 to expose the bottom surface 152 of each via land 15 and expose the side surface 153 of each via land 15. In this embodiment, a portion of the metal layer 62 is also exposed. The via hole 65 is formed by providing energy on the dielectric layer 11. For example, energy may be provided by a laser beam. Because the maximum energy of the laser beam occurs at a center of the beam and the energy decreases from the center of the beam toward a periphery of the beam, the center of the laser beam could damage the metal layer 62. If the metal layer 62 is damaged, chemicals used during subsequent manufacturing stages may seep into a gap between the metal layers 61 and 62, and the metal layers 61 and 62 may peel. However, because the via land 15 is at the center of the via hole 65, the via land 15 can prevent the metal layer 62 from being damaged by the energy at the center of the laser beam. Further, because the laser stops on the via land 15, control of the laser power become easier. The via land 15 design of the present disclosure thus further provides for improved laser power control during manufacture.

Figure 6D:
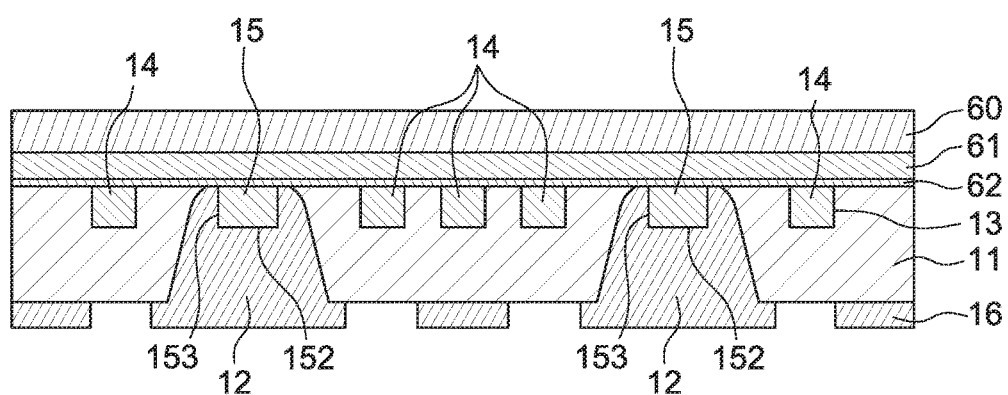

Referring to FIG. 6D, a conductive material such as copper, aluminum, gold, another suitable metal or alloy, or a combination thereof, is plated or otherwise disposed in one or more layers in the via holes 65 to form conductive vias 12 over the via lands 15. A conductive pattern layer 16 may be formed concurrently with the conductive vias 12. Alternatively, the conductive pattern layer 16 may be formed in another process stage. The metal layer 61 and the carrier 60 are then removed by peeling to expose the metal layer 62, and the metal layer 62 can be removed by etching to expose the conductive pattern layer 13. The manufacturing method of FIGS. 6A-6D may be used to form the package substrate 20 as shown in FIGS. 3 and 4.

Figure 7:
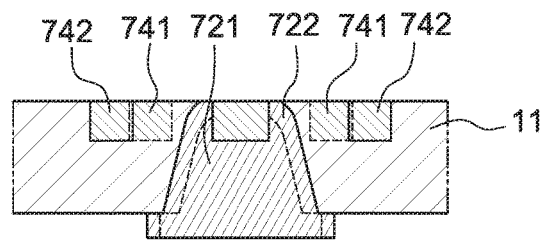
FIG. 7 illustrates a superimposed cross-sectional view of via structures.

FIG. 7 illustrates a cross-sectional view of a conductive via 721 similar to the conductive via 12 of FIGS. 1 and 2 superimposed on a cross-sectional view of a conductive via 722 similar to the conductive via 12 of FIGS. 3 and 4, for comparison. The conductive via 721 provides for higher circuit density than the conductive via 722, because a diameter of the conductive via 721 is relatively smaller than a diameter of the conductive via 722. Accordingly, traces 741 (corresponding to the traces 14 of FIGS. 1 and 2) can be placed closer to the conductive vias 721 than the traces 742 (corresponding to the traces 14 of FIGS. 3 and 4) can be placed with respect to the conductive vias 722. Thus, the via-land structure including the conductive via 721 is a reduced-dimension structure. The via-land structure including the conductive via 722 provides for larger connection areas at a surface of the dielectric layer 111 if desired, while providing for improved manufacturing as described with respect to FIGS. 6A-6D.

Additional embodiments are directed to semiconductor device packages, such as including the package substrate 10 or 20, one or more semiconductor devices (e.g., chips) connected to the package substrate 10 or 20, and a package body disposed over the package substrate 10 or 20 and covering the one or more semiconductor devices.

Figure 8:
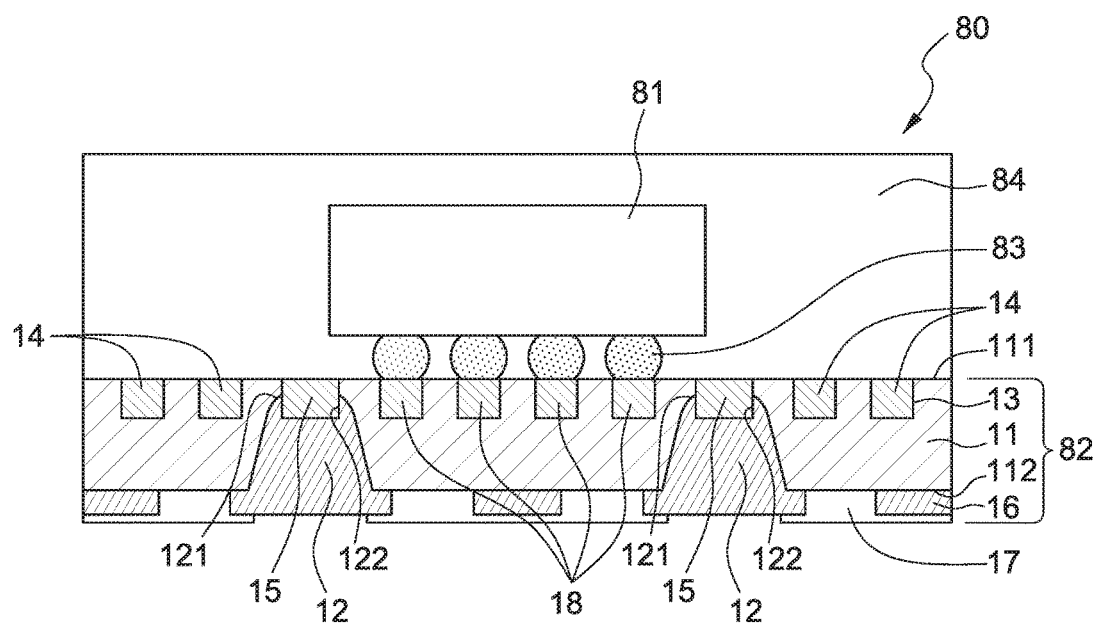
FIG. 8 illustrates a cross-sectional view of a semiconductor device package with a package substrate in accordance with an embodiment of the present disclosure.

FIG. 8 illustrates a semiconductor device package 80 in accordance with an embodiment of the present disclosure. The semiconductor device package 80 includes a semiconductor device 81, a package substrate 82, solder balls 83 and encapsulation layer 84. Similarly to FIGS. 2 and 4, the package substrate 82 of FIG. 8 includes a dielectric layer 11, a conductive pattern layer 13, a conductive pattern layer 16 and a solder resist layer 17, where the conductive pattern layer 13 includes traces 14 and via lands 15, and each via land 15 extends into a corresponding conductive via 12. In the embodiment illustrated in FIG. 8, the semiconductor device package 80 further includes pads 18. The semiconductor device 81 is located on the package substrate 82 and is electrically connected to the pads 18 through the solder balls 83. The encapsulation layer 84 is disposed over the package substrate 82 and encapsulates the semiconductor device 81. The encapsulation layer 84 can be formed using an encapsulation material such as epoxy molding compound (EMC), polyimide (PI), a phenolic, a silicone, or other encapsulation material.

As used herein, the singular terms "a," "an," and "the" may include plural referents unless the context clearly dictates otherwise.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least approximately $10^5$ S/m or at least approximately $10^6$ S/m. The electrical conductivity of a material can sometimes vary with temperature. Unless otherwise specified, the electrical conductivity of a material is measured at room temperature.

As used herein, the terms "approximately," "substantially" and "about" refer to a considerable degree or extent. When used in conjunction with an event or circumstance, the terms can encompass instances in which the event or circumstance occurs precisely as well as instances in which the event or circumstance occurs to a close approximation, such as when accounting for typical tolerance levels of the manufacturing methods described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
   a package substrate, comprising:
      a dielectric layer having a first surface;
      a conductive via disposed in the dielectric layer and recessed from the first surface of the dielectric layer, the conductive via having a first portion and a second portion, the first portion having a side surface that has a curvature, the second portion having a side surface that tapers towards the first surface of the dielectric layer; and
      a first conductive pattern layer exposed from the first surface of the dielectric layer, wherein the first conductive pattern layer comprises a trace, a pad and a via land, the via land extends into the conductive via, and a circumferential portion of the via land is encompassed by the first portion of the conductive via;
   an electrically connecting element; and
   a semiconductor device, the semiconductor device located on the package substrate and electrically connected to the pad through the electrically connecting element.

2. The semiconductor device package of claim 1, wherein a portion of the via land is in contact with the dielectric layer.

3. The semiconductor device package of claim 1, wherein the first conductive pattern layer is coplanar with the first surface of the dielectric layer.

4. The semiconductor device package of claim 1, wherein the conductive via contacts a lateral surface of the via land around a circumference of the via land.

5. The semiconductor device package of claim 1, wherein the first conductive pattern layer does not protrude from the first surface of the dielectric layer.

6. The semiconductor device package of claim 1, wherein the via land protrudes from a top surface of the conductive via.

7. The semiconductor device package of claim 1, further comprising a second conductive pattern layer disposed on a second surface of the dielectric layer and electrically connected to the conductive via.

8. The semiconductor device package of claim 7, wherein the second conductive pattern layer and the conductive via are an integrated structure.

9. The semiconductor device package of claim 1, wherein the dielectric layer comprises a sheet made from pre-impregnated composite fibers.

10. A semiconductor device package, comprising:
    a package substrate, comprising:
       a dielectric layer having a first surface;
       a conductive via extending through the dielectric layer, recessed from the first surface of the dielectric layer, and having a first portion and a second portion, the first portion having a curved surface and defining a recess, the second portion having a tapered surface; and
       a first conductive pattern layer exposed from the first surface of the dielectric layer, wherein the first conductive pattern layer comprises a trace, a pad and a via land, and the via land is embedded in the recess of the first portion of the conductive via;
    an electrically connecting element; and a semiconductor device, the semiconductor device located on the package substrate and electrically connected to the pad through the electrically connecting element.

11. The semiconductor device package of claim 10, wherein the first conductive pattern layer does not protrude from the first surface of the dielectric layer.

12. The semiconductor device package of claim 10, wherein the via land protrudes from a top surface of the conductive via.

13. The semiconductor device package of claim 10, further comprising a second conductive pattern layer disposed on a second surface of the dielectric layer and electrically connected to the conductive via.

14. The semiconductor device package of claim 13, wherein the second conductive pattern layer and the conductive via are an integrated structure.

15. The semiconductor device package of claim 8, further comprising a solder resist layer covering and in contact with portions of the second conductive pattern layer.

16. The semiconductor device package of claim 14, further comprising a solder resist layer covering and in contact with portions of the second conductive pattern layer.

17. A semiconductor device package, comprising:
a package substrate, comprising:
  a dielectric layer having a top surface;
  a conductive via recessed from the top surface of the dielectric layer and extending through the dielectric layer, the conductive via having a top surface and a top portion having a side surface, the top portion of the conductive via defining a recess, the side surface of the top portion having a curvature towards the top surface of the dielectric layer; and
  a conductive pattern layer exposed from the top surface of the dielectric layer, wherein the conductive pattern layer comprises a trace, a pad and a via land, and the via land is embedded in the recess of the top portion of the conductive via and protrudes from the top surface of the conductive via;
an electrically connecting element; and
a semiconductor device, the semiconductor device located on the package substrate and electrically connected to the pad through the electrically connecting element.

* * * * *